United States Patent
Baek et al.

(10) Patent No.: US 7,781,849 B2
(45) Date of Patent: Aug. 24, 2010

(54) SEMICONDUCTOR DEVICES AND METHODS OF FABRICATING THE SAME

(75) Inventors: Jong-min Baek, Suwon-si (KR); Seong-hwee Cheong, Seoul (KR); Gil-heyun Choi, Seoul (KR); Tae-ho Cha, Yongin-si (KR); Hee-sook Park, Seoul (KR); Byung-hak Lee, Suwon-si (KR); Jae-hwa Park, Yongsin-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 12/315,436

(22) Filed: Dec. 3, 2008

(65) Prior Publication Data
US 2009/0189229 A1    Jul. 30, 2009

(30) Foreign Application Priority Data
Jan. 29, 2008    (KR)    .................. 10-2008-0009061

(51) Int. Cl.
*H01L 29/78*    (2006.01)
*H01L 23/48*    (2006.01)
*H01L 23/52*    (2006.01)
*H01L 29/40*    (2006.01)
*H01L 29/49*    (2006.01)

(52) U.S. Cl. ................. 257/412; 257/770; 257/E29.16; 257/E21.621; 438/197; 438/585

(58) Field of Classification Search ....................... None
See application file for complete search history.

(56) References Cited

U.S. PATENT DOCUMENTS

| 4,090,875 | A  |   | 5/1978  | Ludwig |         |
|-----------|----|---|---------|--------|---------|
| 6,797,614 | B1 | * | 9/2004  | Paton et al. | 438/655 |
| 2005/0280118 | A1 | * | 12/2005 | Lin et al. | 257/618 |
| 2007/0049047 | A1 | * | 3/2007  | Fujimoto et al. | 438/759 |
| 2007/0099365 | A1 | * | 5/2007  | Lim et al. | 438/197 |
| 2008/0017984 | A1 | * | 1/2008  | Farooq et al. | 257/738 |

FOREIGN PATENT DOCUMENTS

| JP | 58075862     |   | 5/1983  |
| JP | 06077286     |   | 3/1994  |
| JP | 06-283623    | * | 10/1994 |
| JP | 2000-169923  | * | 6/2000  |
| KR | 2000-0003918 | * | 6/2000  |
| KR | 10-0618895   | * | 8/2006  |

* cited by examiner

*Primary Examiner*—Andy Huynh
*Assistant Examiner*—Hoang-Quan T Ho
(74) *Attorney, Agent, or Firm*—Mills & Onello, LLP

(57) ABSTRACT

Provided are semiconductor devices and methods of fabricating the same, and more specifically, semiconductor devices having a W—Ni alloy thin layer that has a low resistance, and methods of fabricating the same. The semiconductor devices include the W—Ni alloy thin layer. The weight of Ni in the W—Ni alloy thin layer may be in a range from approximately 0.01 to approximately 5.0 wt % of the total weight of the W—Ni alloy thin layer.

16 Claims, 7 Drawing Sheets

SEMICONDUCTOR DEVICES AND METHODS OF FABRICATING THE SAME

CROSS-REFERENCE TO RELATED APPLICATION

This application claims the benefit of Korean Patent Application No. 10-2008-0009061, filed on Jan. 29, 2008, in the Korean Intellectual Property Office, the disclosure of which is incorporated herein in its entirety by reference.

FIELD

Exemplary embodiments relate to semiconductor devices and methods of fabricating the same, for example, to semiconductor devices that include a tungsten-alloy thin layer having a low resistance and methods of fabricating the same.

BACKGROUND

Figure 1:
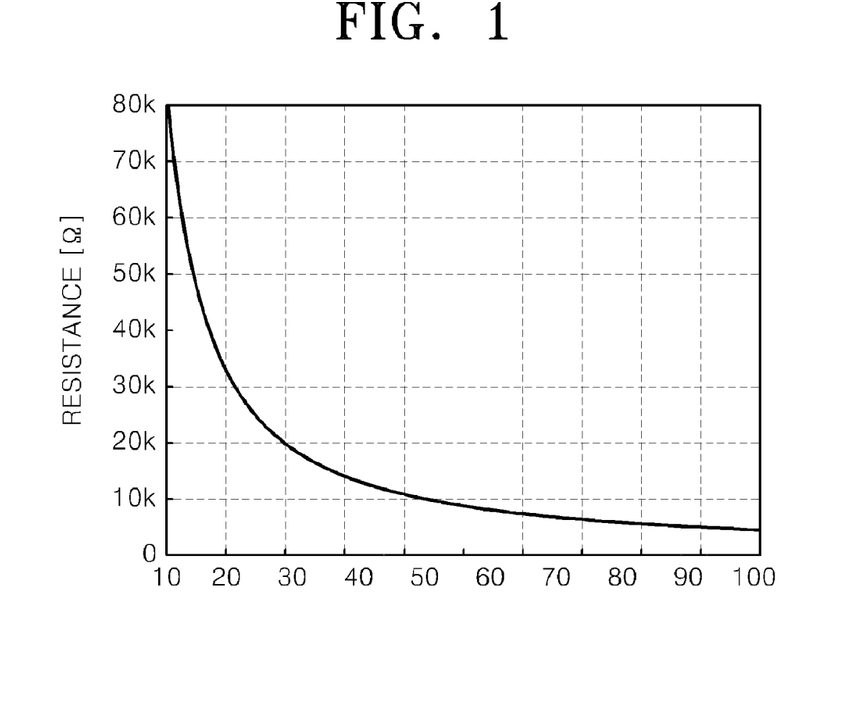
FIG. 1 is a graph showing resistance of a gate line as a function of reduction of a design rule.

FIG. 1 is a graph showing resistance of a gate line as a function of reduction of a design rule.

Referring to FIG. 1, the horizontal axis indicates a line width of the gate line in nm, and the vertical axis indicates the resistance of the gate line in Ω. When the line width of the gate line is reduced, the resistance of the gate line-increases rapidly. In order to reduce the rapidly increasing resistance of the gate line due to an increase in integration density and the reduction of the design rule in a semiconductor device, the resistivity of a material used for forming the gate line can be reduced.

Polysilicon, fabricated by a low pressure chemical vapor deposition (LP CVD) method, has been used in a gate structure in which a conductive thin layer is deposited on a gate oxide layer, because polysilicon is stable, can be easily bonded to a thin layer, can be readily deposited at room temperature, and can be readily patterned by an etching process. However, polysilicon can be inappropriate for a high density integrated circuit since polysilicon has a relatively high electrical resistance even though the electrical conductivity can be increased by injecting a dopant into polysilicon.

In view of the advantages of polysilicon, various structures have been developed to reduce the electrical resistance of polysilicon. Examples of developed structures include a polyside structure in which a metal silicide, for example, $WSi_2$, $TiSi_2$, $TaSi_2$, $MoSi_2$, is deposited on polysilicon; a salicide structure in which a metal and silicon are annealed; a structure that includes a pure metal silicide or a nitride; and a structure that includes a metal.

In some polyside structures, such as, a $WSi_x$ structure, problematic peeling of a thin layer and problematic abnormal oxidation in a subsequent insulation layer deposition process can occur. The peeling of a thin layer is related to the adhesion force and stress of the thin layer, and the abnormal oxidation is related to an atom ratio of tungsten to silicon and a deposition condition in a subsequent insulation layer deposition process. Also, the electrical resistance of a polyside structure is determined by the resistance of $WSi_x$, and increases due to effects caused by grain boundaries and interfaces in addition to a bulk resistance with the reduction of a line width. A specific resistance of a CVD $WSi_x$ obtained using commercially available equipment can be approximately 40 to 80 $\mu\Omega$-cm, so there can be a limit in applying this structure to a high density integrated circuit.

In some embodiments, a metal gate has been introduced to further increase device speed. A most commonly used material in this regard is tungsten. In a method of forming tungsten using a CVD method, fluoride (F) atoms can affect the purity of the tungsten. With regard to a gate structure, since a step coverage may not be important, a physical vapor deposition (PVD) method can be used. However, if tungsten directly contacts a gate oxide layer, tungsten atoms, which are heavy, can damage a surface of the gate oxide layer when the tungsten atoms are deposited, or there is a risk of forming $WO_x$ at an interface between tungsten and the gate oxide layer during a subsequent process. Thus, a barrier thin layer, for example, a titanium nitride, may be used.

When a W thin layer is formed on a TiN thin layer that is used as a barrier thin layer, the W thin layer grows in a pillar shape along a minute grain structure of TiN, and thus, the specific resistance of the W thin layer may be increased.

SUMMARY

Exemplary embodiments provide a semiconductor devices that include a tungsten (W) thin layer having a low specific resistance.

Exemplary embodiments provide methods of fabricating a semiconductor device that includes a W thin layer having a low specific resistance.

According to an aspect of exemplary embodiments, there is provided a semiconductor device including a W—Ni alloy thin layer.

The weight of Ni in the W—Ni alloy thin layer may be in a range from 0.01 to 5.0 wt % of the total weight of the W—Ni alloy thin layer.

The W—Ni alloy thin layer may constitute a part of a gate pattern, a part of a bit line, a part of a contact pattern, and a part of a wire pattern.

The W—Ni alloy thin layer may be formed by annealing a composite thin layer of at least one W thin layer and at least one Ni thin layer, which is formed by alternately and sequentially depositing the at least one W thin layer and the at least one Ni thin layer, in a temperature range from approximately 750 to approximately 950° C. for a time range from approximately 5 to approximately 15 minutes, or may be formed by physical vapor deposition (PVD) using a sputtering target containing W and Ni.

According to another aspect of exemplary embodiments, there is provided a semiconductor device including: a gate insulating layer pattern; a polysilicon layer pattern formed on the gate insulating layer pattern; an ohmic contact layer formed on the polysilicon layer pattern; a barrier layer formed on the ohmic contact layer; and a gate electrode layer formed on the barrier layer, wherein the gate electrode layer includes a W—Ni alloy thin layer.

The ohmic contact layer may include $WSi_x$, Ti, or a combination of $Wsi_x$ and Ti, and the barrier layer may include TiN, WN, or a combination of TiN and WN.

The weight of Ni in the W—Ni alloy thin layer may be in a range from 0.01 to 5.0 wt % of the total weight of the W—Ni alloy thin layer.

The W—Ni alloy thin layer may be formed by annealing a composite thin layer of at least one W thin layer and at least one Ni thin layer, which is formed by alternately and sequentially depositing the at least one W thin layer and the at least one Ni thin layer, at a temperature range from approximately 750 to approximately 950° C. for a time range from approximately 5 to approximately 15 minutes, or may be formed by PVD using a sputtering target containing an alloy of W and Ni.

According to an aspect of exemplary embodiments, there is provided a method of fabricating a semiconductor device having a W—Ni alloy thin layer that constitutes a part of a gate pattern, a part of a bit line pattern, a part of a contact pattern, or a part of a wire pattern, including: forming a composite thin layer of at least one W thin layer and at least one Ni thin layer formed by alternately and sequentially depositing the at least one W thin layer and the at least one Ni thin layer; and annealing the composite thin layer.

In the forming of the composite thin layer, the at least one W thin layer and the at least one Ni thin layer may be formed by PVD.

The annealing of the composite thin layer may include annealing the composite thin layer in a temperature range from approximately 750 to approximately 950° C. for a time range from approximately 5 to approximately 15 minutes.

According to another aspect of exemplary embodiments, there is provided a method of fabricating a semiconductor device having a W—Ni alloy thin layer that constitutes a part of a gate pattern, a part of a bit line pattern, a part of a contact pattern, or a part of a wire pattern, including forming the W—Ni alloy thin layer by PVD using a sputtering target containing an alloy of W and Ni.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Exemplary embodiments will now be described more fully with reference to the accompanying drawings, in which exemplary embodiments are shown. The invention may, however, be embodied in many different forms and should not be construed as limited to the exemplary embodiments set forth herein. In the drawings, lengths and sizes of layers and regions may be exaggerated for clarity.

Like reference numerals in the drawings denote like elements. It will also be understood that when a layer is referred to as being "on" another layer or substrate, it can be directly on the other layer or substrate, or intervening layers may also be present. Also, spatially relative terms, such as "below" or "lower" and the like, may be used herein for ease to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "below" can encompass both an orientation of above and below.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section.

Figure 2:
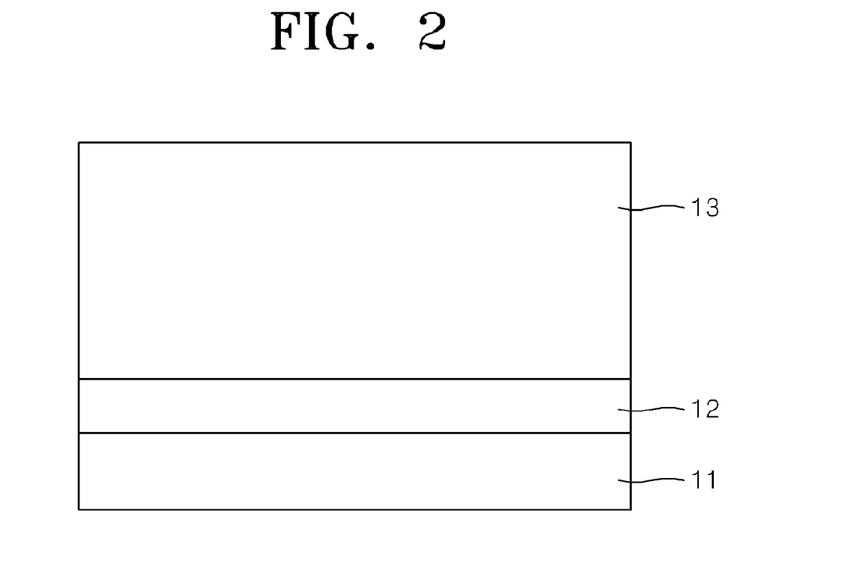
FIG. 2 is a cross-sectional view of a structure having a W thin layer deposited on a TiN thin layer.

FIG. 2 is a cross-sectional view of a structure having a W thin layer deposited on a TiN thin layer.

Referring to FIG. 2, a barrier thin layer 12 is formed on an oxide thin layer 11. The oxide thin layer 11 may be a plasma enhanced oxide layer formed to a thickness of approximately 1000 Å. The barrier thin layer 12 may be a TiN thin layer formed to a thickness of approximately 100 Å. A W thin layer 13 is deposited on the barrier thin layer 12 using, for example, a physical vapour deposition (PVD) method. The W thin layer 13 may be deposited to a thickness of approximately 400 Å, for example, by depositing two W thin layers each having a thickness of approximately 200 Å.

Figure 3:
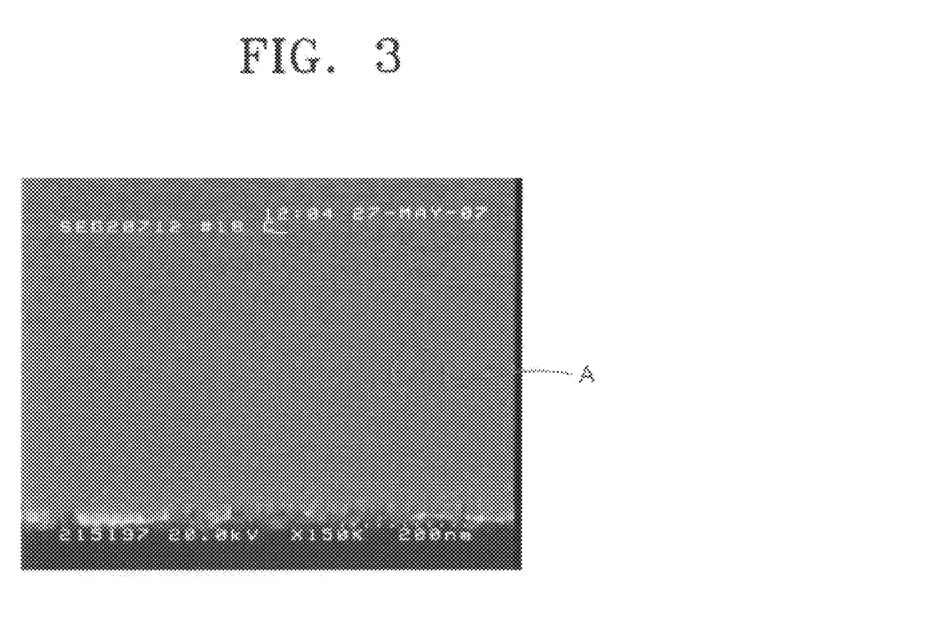
FIGS. 3 and 4 are scanning electron microscope (SEM) images of a surface of the W thin layer of FIG. 2 before and after annealing, respectively.
Figure 4:
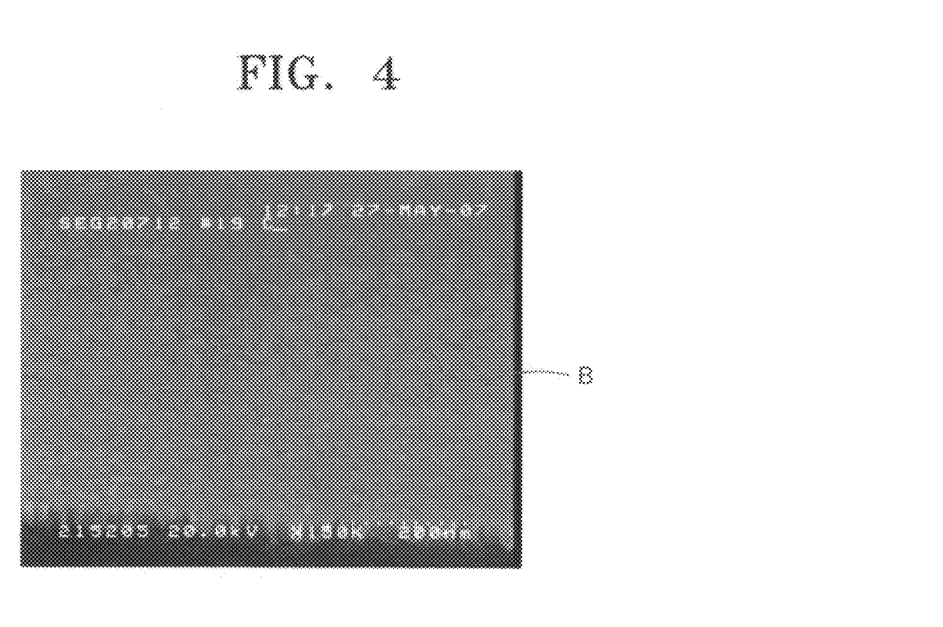

FIGS. 3 and 4 are scanning electron microscopic (SEM) images of a surface of the W thin layer 13 of FIG. 2 before and after annealing, respectively.

Referring to FIG. 3, when a surface A of a W thin layer deposited on a TiN thin layer is observed, it is seen that particles on the surface of the W thin layer are relatively minute. This is because the W thin layer grew in a pillar shape along a minute grain structure of the TiN thin layer which is a lower structure. After depositing the W thin layer on the TiN thin layer, an annealing process was not additionally performed with respect to the W thin layer. The specific resistance of the W thin layer measured prior to performing the annealing process was 32.3 μΩ-cm. The specific resistance of a metal thin layer is generally reduced as the grain size of the metal thin layer increases.

Referring to FIG. 4, when a surface B of a W thin layer is observed after annealing the W thin layer deposited on a TiN thin layer, it is seen that particles of a surface of the W thin layer are relatively minute. The annealing process for the W thin layer was performed at a temperature of 850° C. for 10 minutes. The specific resistance of the W thin layer measured after annealing the W thin layer was 30.0 μΩ-cm, which is approximately 7% lower than that of the W thin layer prior to performing an annealing.

Figure 5:
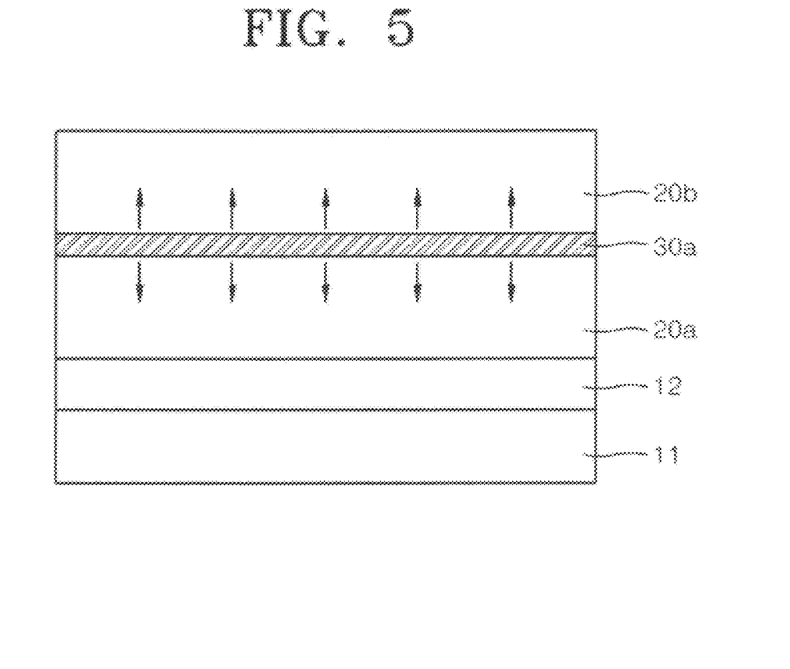
FIG. 5 is a cross-sectional view illustrating a method of fabricating a W—Ni alloy thin layer according to some embodiments.

FIG. 5 is a cross-sectional view illustrating a method of fabricating a W—Ni alloy thin layer according to some embodiments.

Referring to FIG. 5, a barrier thin layer 12 is formed on an oxide thin layer 11. The oxide thin layer 11 may be, for example, a plasma enhanced oxide layer formed to a thickness of approximately 1000 Å. The barrier thin layer 12 may be a TiN thin layer formed to a thickness of approximately 100 Å. A first W thin layer 20a is formed to a thickness of approximately 200 Å on the barrier thin layer 12. After depositing a Ni thin layer 30a on the first W thin layer 20a, a second W thin layer 20b is deposited to a thickness of approximately 200 Å on the Ni thin layer 30a. In some embodiments, the first W thin layer 20a and the second W thin layer 20b are deposited using a PVD method.

A composite thin layer 20a, 30a, and 20b formed by alternately and sequentially depositing the W thin layer and the Ni thin layer are annealed. The annealing process can be performed at a temperature of approximately 850° C. for approximately 10 minutes with respect to the composite thin layer 20a, 30a, and 20b.

Due to the annealing, atoms from the Ni thin layer 30a can diffuse into the first W thin layer 20a and the second W thin layer 20b. Without being bound by theory, it is believed that the Ni atoms can diffuse into grain boundaries of tungsten and cause tungsten grains to grow. The composite thin layer 20a, 30a, and 20b formed by alternately and sequentially depositing the W thin layer and the Ni thin layer can become a W—Ni alloy thin layer.

The thickness of the Ni thin layer 30a is an important factor for determining the composition of the W—Ni alloy thin layer. In FIG. 5, the Ni thin layer 30a is formed to a thickness of approximately 10 Å, and in this example, the weight of Ni in the overall W—Ni alloy thin layer is approximately 1 wt %.

Figure 6:
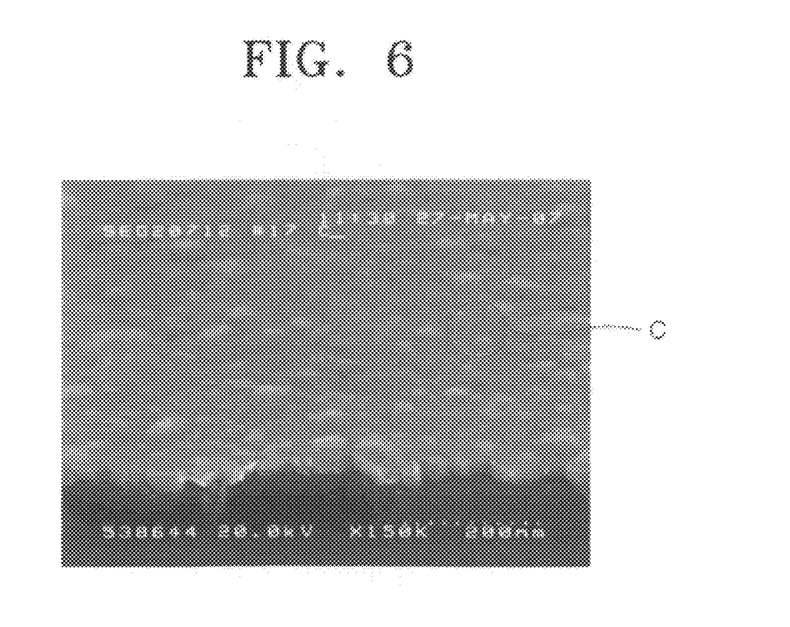
FIG. 6 is an SEM image of a surface of the W—Ni alloy thin layer of FIG. 5.

FIG. 6 is an SEM image of a surface C of the W—Ni alloy thin layer of FIG. 5.

Referring to FIG. 6, when the surface C including the W—Ni alloy thin layer is compared to a surface B (shown in FIG. 4) of the W thin layer that was annealed without adding Ni, it is observed that particles of the surface C of the W—Ni alloy thin layer are greater than the particles of the surface B of the W thin layer. The specific resistance of the W—Ni alloy thin layer was measured as approximately 17.6 μΩ-cm, which is approximately 59% of the specific resistance of the W thin layer annealed without adding Ni. Thus, when the W—Ni alloy thin layer is annealed, the reduction effect of specific resistance is evident.

Figure 7:
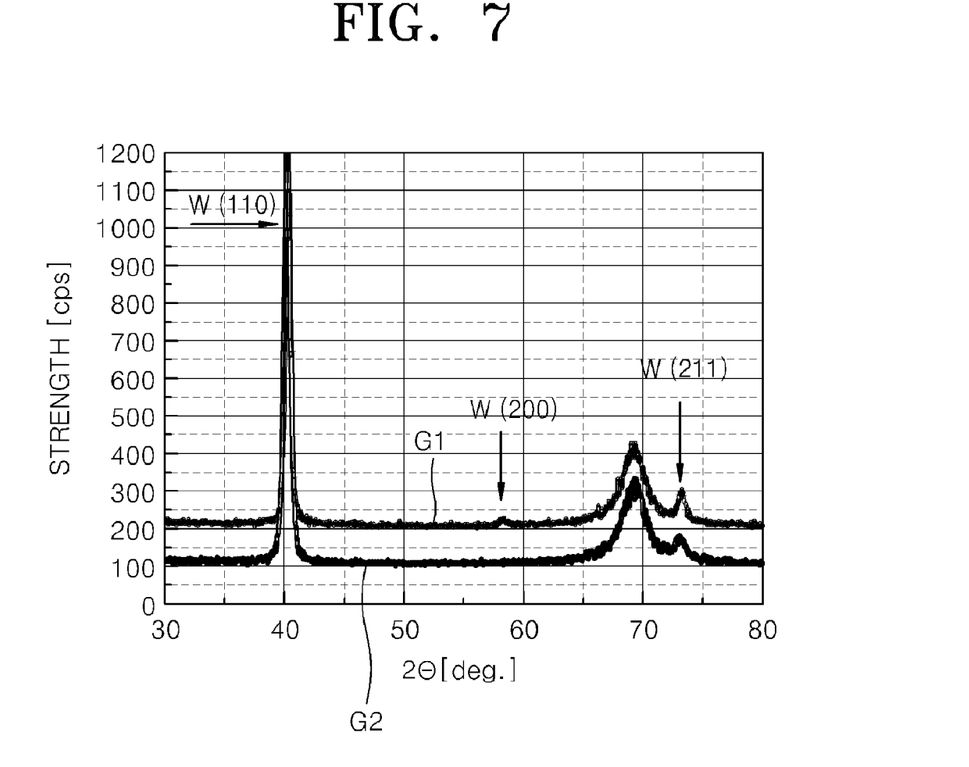
FIG. 7 are XRD patterns of the W—Ni alloy thin layer of FIG. 5.

FIG. 7 shows an X-ray diffraction (XRD) analysis of the W—Ni alloy thin layer of FIG. 5.

Referring to FIG. 7, a second pattern G2, which is an XRD analysis result of a composite thin layer formed by alternately and sequentially depositing a W thin layer and Ni thin layer before annealing, and a first pattern G1, which is an XRD analysis result of the composite thin layer after annealing, are compared.

From the XRD analysis results, since only an α-W phase is observed before and after annealing the composite thin layer, it can be said that a W—Ni inter-metallic compound is not formed and also no phase change occurs through the annealing.

Also, after annealing the composite thin layer, peak (200) and peak (211) are increased and the intensity of main peak (110) is reduced. From this result, it is believed that the reduction of grain boundary energy functions as an important driving force for grain growth. Also, a full width at half maximum (FWHM), which represents grain size, is reduced for all peaks, and thus, it is believed that the grains grow regardless of directionality.

Meanwhile, when a cross-section of the W—Ni alloy thin layer is analyzed using a transmission electron microscope (TEM), an interface between the first and second W thin layers 20a and 20b and the Ni thin layer 30a is not observed. From this result, it is believed that the growth of grains is caused by the diffusion of Ni atoms into grain boundaries of tungsten due to the annealing of the W—Ni alloy thin layer.

Figure 8:
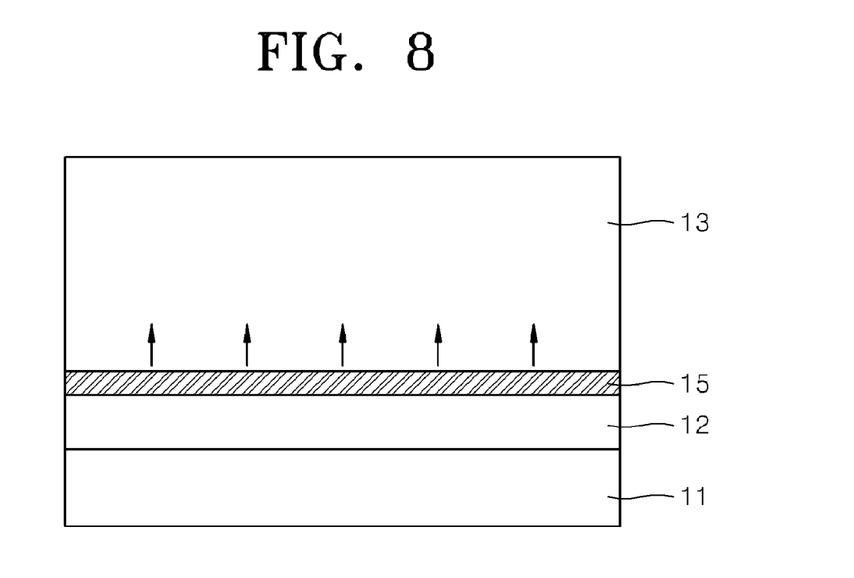
FIG. 8 is a cross-sectional view illustrating method of fabricating a W—Ni alloy thin layer according to some embodiments.

FIG. 8 is a cross-sectional view illustrating a method of fabricating a W—Ni alloy thin layer according to some embodiments.

Referring to FIG. 8, a barrier thin layer 12 is formed on an oxide thin layer 11. The oxide thin layer 11 may be, for example, a plasma enhanced oxide layer formed to a thickness of approximately 1000 Å. The barrier thin layer 12 may be a TiN thin layer formed to a thickness of approximately 100 Å. A Ni thin layer 15 is deposited to a thickness of approximately 10 Å on the barrier thin layer 12, and a W thin layer 13 can be deposited on the Ni thin layer 15 using a PVD method. The W thin layer 13 can be formed to a thickness of approximately 400 Å, which can be realized by depositing two W thin layers each having a thickness of approximately 200 Å.

The composite thin layer of the W thin layer 13 and the Ni thin layer 15 can be annealed at a temperature of approximately 850° C. for approximately 10 minutes.

Ni atoms of the Ni thin layer 15 can diffuse into the W thin layer 13 due to the annealing. In particular, it is believed that the diffusion of the Ni atoms into grain boundaries of tungsten causes the growth of tungsten grains. Thus, the W thin layer 13 and the Ni thin layer 15 form a W—Ni alloy thin layer due to the annealing.

Figure 9:
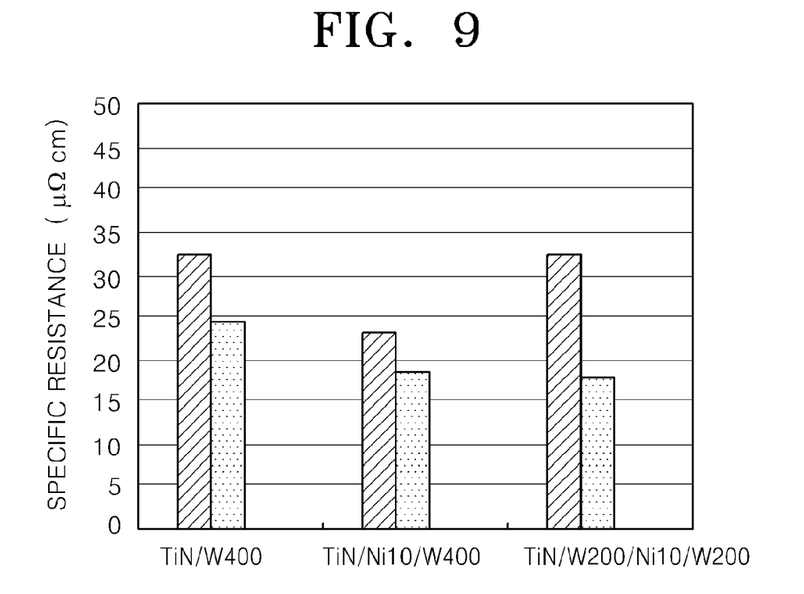
FIG. 9 is a graph showing a comparison of specific resistances of the structures of FIGS. 2, 5, and 8.

FIG. 9 is a graph showing a comparison of specific resistances of the structures of FIGS. 2, 5, and 8.

Referring to FIG. 9, with respect to the W thin layer 13 (shown in FIG. 2) having a thickness of approximately 400 Å formed on the barrier thin layer 12 (shown in FIG. 2), the specific resistances before and after annealing at a temperature of 850° C. for 10 minutes are respectively measured as approximately 32.3 μΩ-cm and approximately 30.0 μΩ-cm.

With respect to the Ni thin layer 15 (shown in FIG. 8) having a thickness of approximately 10 Å and the W thin layer 13 (shown in FIG. 8) having a thickness of approximately 400 Å, which are formed on the barrier thin layer 12 (shown in FIG. 8), the specific resistances measured before and after annealing at a temperature of approximately 850° C. for approximately 10 minutes were respectively approximately 24.0 μΩ-cm and approximately 19.0 μΩ-cm.

With respect to the Ni thin layer 30a (shown in FIG. 5) having a thickness of approximately 10 Å and the first and second W thin layers 20a and 20b (shown in FIG. 5) having a thickness of approximately 400 Å, which are formed on the barrier thin layer 12 (shown in FIG. 5), the specific resistances measured before and after annealing at a temperature of approximately 850° C. for approximately 10 minutes were respectively approximately 32.3 μΩ-cm and approximately 17.6 μΩ-cm.

Referring to the above measurement results, it is seen that the reduction of the specific resistance before and after annealing is further effective in the case in which the Ni thin layer is disposed between the W thin layers (e.g., FIG. 5) compared to a case in which the Ni thin layer is deposited on a lower or upper side of the W thin layer (e.g., FIG. 8). It is believed that this effect is because, if the Ni thin layer is disposed between the W thin layers, the diffusion of Ni atoms into the W thin layers is more uniform and made easier.

Thus, for the W—Ni alloy thin layer according to some embodiments, the annealing may be performed after disposing the Ni thin layer between the W thin layers.

Also, for the W—Ni alloy thin layer according to other embodiments, the W—Ni alloy thin layer may be formed by depositing a sputtering target that includes a W—Ni alloy using a PVD method.

When highly energized particles (for example, ions accelerated into an electric field) collide with a surface of the sputtering target, atoms and/or molecules from the surface of the sputtering target bounce to the outside of the surface by exchanging momentum with the highly energized particles, and thus, the atoms and/or molecules can be deposited on a desired location of the semiconductor device.

If the PVD method is used using a sputtering target that includes a W—Ni alloy, a W—Ni alloy thin layer in which Ni is uniformly distributed may be realized.

In the foregoing descriptions, the annealing process is performed at a temperature of 850° C. for 10 minutes. However, the annealing process described above is only an example, and embodiments are not limited to the above annealing conditions. In other embodiments, when an annealing process is performed at a temperature of approximately 750 to approximately 950° C. for approximately 5 to approximately 15 minutes, the same annealing result is obtained.

However, if the annealing process is performed at a temperature of less than approximately 750° C. for less than approximately 5 minutes, the Ni atoms may not sufficiently diffuse into the W thin layer, and thus, the reduction of specific resistance may not be sufficiently achieved.

Also, if the annealing process is performed at a temperature exceeding approximately 950° C. for more than approximately 15 minutes, various undesirable problems can occur on other elements of a semiconductor device. For example, if excessive annealing is performed, a leakage current can increase due to degradation of gate oxide layer.

The W—Ni alloy thin layer according to some embodiments may be configured to be a part of a gate pattern, and also, may be configured to be a part of a bit line pattern, a contact pattern, and/or a wire pattern.

In a structure in which a W thin layer and a Ni thin layer are sequentially stacked, the number of the Ni thin layers is not limited and may be appropriately varied according to conditions such as an annealing process.

Figure 10:
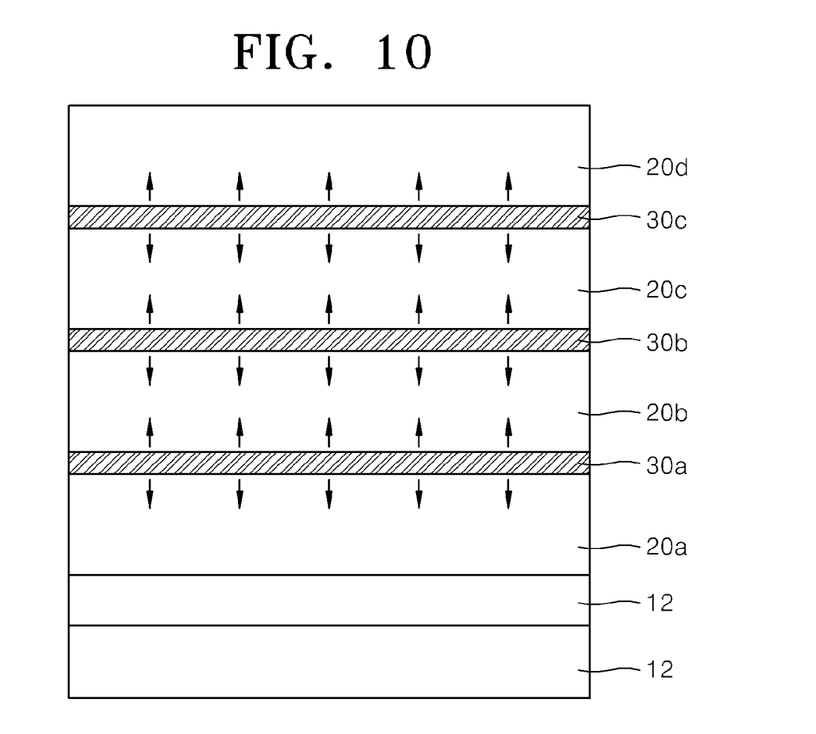
FIG. 10 is a cross-sectional view illustrating a method of fabricating a W—Ni alloy thin layer according to some embodiments.
Figure 11:
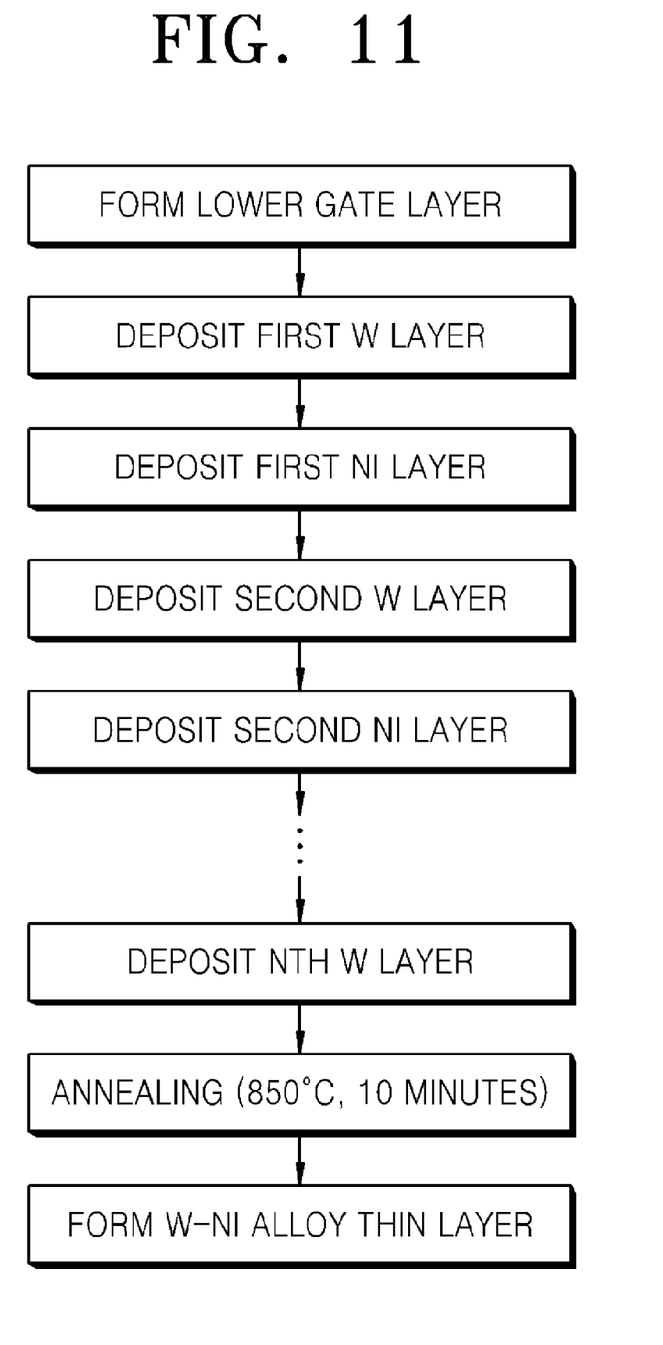
FIG. 11 is a flow diagram showing a sequence of fabricating a W—Ni alloy thin layer according to some embodiments.

FIG. 10 is a cross-sectional view illustrating a method of fabricating a W—Ni alloy thin layer according to some embodiments. FIG. 11 is a flow diagram showing a sequence of fabricating a W—Ni alloy thin layer according to other embodiments.

Referring to FIG. 10, a barrier thin layer 12 is formed on an oxide thin layer 11. The oxide thin layer 11 may be, for example, a plasma enhanced oxide layer having a thickness of approximately 1000 Å. The barrier thin layer 12 may be formed of TiN to a thickness of approximately 100 Å. Next, a first W thin layer 20a, a first Ni thin layer 30a, a second W thin layer 20b, a second Ni thin layer 30b, a third W thin layer 20c, a third Ni thin layer 30c, and a fourth W thin layer 20d are sequentially formed on the barrier thin layer 12. At least one Ni thin layer is interposed between W thin layers.

A composite thin layer formed by depositing the first through fourth W thin layers 20a, 20b, 20c, and 20d and the first through third Ni thin layers 30a, 30b, and 30c is annealed at a temperature of approximately 850° C. for approximately 10 minutes. However, the annealing conditions are only exemplary and not limited to the above conditions. As described above, an identical annealing effect may be obtained when the annealing is performed in a temperature range from approximately 750 to approximately 950° C. for a time range from approximately 5 to approximately 15 minutes.

Ni atoms of the first through third Ni thin layers 30a, 30b, and 30c are diffused into the first through fourth W thin layers 20a, 20b, 20c, and 20d due to the annealing. In particular, it is believed that the growing of tungsten grains is caused by the Ni atoms diffusing into grain boundaries of tungsten. Thus, the composite thin layer formed by depositing the first through fourth W thin layers 20a, 20b, 20c, and 20d and the first through third Ni thin layers 30a, 30b, and 30c becomes a W—Ni alloy thin layer due to the annealing.

The composition of the W—Ni alloy thin layer may be effectively controlled by thicknesses of the first through fourth W thin layers 20a, 20b, 20c, and 20d and the first through third Ni thin layers 30a, 30b, and 30c. For example, the first through fourth W thin layers 20a, 20b, 20c, and 20d may be formed to a thickness of approximately 200 Å, and the first through third Ni thin layers 30a, 30b, and 30c may be formed to a thickness of approximately 10 Å. In this case, the weight of Ni in the total weight of the W—Ni alloy thin layer after annealing may be approximately 1 wt %.

In the W—Ni alloy thin layer according to some embodiments, the weight of Ni may be approximately 5 wt % or less of the total weight of the W—Ni alloy thin layer. If the weight of Ni exceeds approximately 5 wt % of the total weight of the W—Ni alloy thin layer, the amount of Ni atoms can exceed a limit for accommodating the Ni atoms in tungsten, and Ni particles may precipitate resulting in the increase of the resistance of the W—Ni alloy thin layer.

The weight of Ni may be 0.01 wt % or more. If the weight of Ni is less than approximately 0.01 wt % of the total weight of the W—Ni alloy thin layer, there may be no effect on the electrical resistance in a W—Ni alloy thin layer.

From experimental results obtained from various embodiments, the weight of Ni in the W—Ni alloy thin layer may be in a range from approximately 0.01 to approximately 5 wt %.

For example, the weight of Ni in the W—Ni alloy thin layer may be in a range from approximately 0.01 to approximately 2 wt %. If the weight of Ni is less than approximately 2 wt %, a further thermodynamically stable W—Ni alloy thin layer may be formed.

As another example, the weight of Ni in the W—Ni alloy thin layer may be in a range from approximately 0.01 to approximately 1 wt %. If the weight of Ni is less than approximately 1 wt % in the W—Ni alloy thin layer, a thermal damage to the semiconductor device may be reduced (e.g., minimized) since a reaction speed for forming the W—Ni alloy thin layer can be increased.

In another version of the W—Ni alloy thin layer according to other embodiments, the first through fourth W thin layers 20a, 20b, 20c, and 20d may have thicknesses different from each other, and also, the first through third Ni thin layers 30a, 30b, and 30c may have thicknesses different from each other.

The first through fourth W thin layers 20a, 20b, 20c, and 20d and the first through third Ni thin layers 30a, 30b, and 30c may be deposited using a PVD method or a CVD method.

FIG. 11 is a flow diagram showing a sequence of a method of fabricating a gate electrode layer that constitutes a gate structure. A lower gate layer may be configured by a combination of a gate insulating layer, a polysilicon layer pattern, an ohmic contact layer, and a barrier layer.

At least one Ni thin layer is interposed between W thin layers. The variable "N" in the flow diagram is an integer greater than 2, for example, the N value in the structure shown in FIG. 10 is 4.

The annealing process can be performed at a temperature of approximately 850° C. for approximately 10 minutes for a composite thin layer formed of W thin layers and Ni thin layers. However, these annealing conditions are exemplary, and as described above, an identical annealing effect may be obtained when the annealing is performed at a temperature range from approximately 750 to approximately 950° C. for a time range from approximately 5 to approximately 15 minutes.

Figure 12:
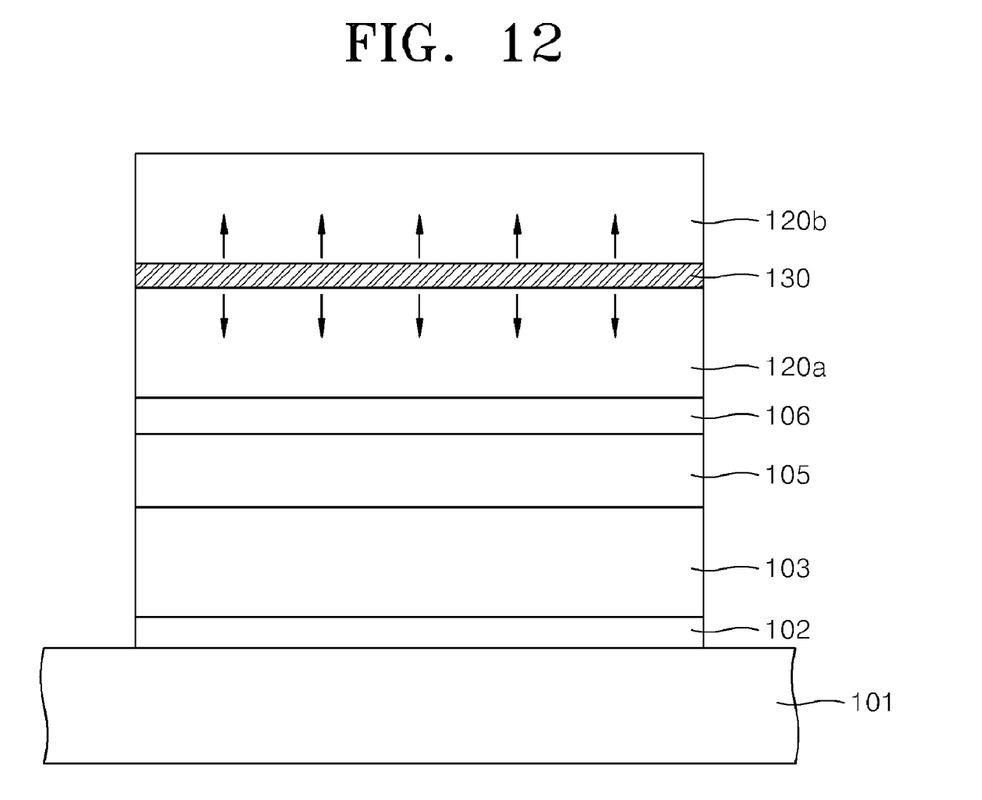
FIG. 12 is a cross-sectional view of a structure of a W—Ni alloy thin layer that constitutes a portion of a gate pattern, according to certain embodiments.

FIG. 12 is a cross-sectional view showing a structure of a W—Ni alloy thin layer that constitutes a portion of a gate pattern, according to some embodiments.

Referring to FIG. 12, a gate insulating layer 102 is formed on a semiconductor substrate 101. A polysilicon layer pattern 103, an ohmic contact layer 105, and a barrier layer 106 are sequentially formed on the gate insulating layer 102.

The ohmic contact layer 105 may be formed of $WSi_x$, Ti, or a combination of $WSi_x$ and Ti, and the barrier layer 106 may be formed of TiN, WN, or a combination of TiN and WN.

The $WSi_x$ may be deposited using a CVD method. For example, the $WSi_x$ may be deposited using a gas containing silicon as a source gas, for example, monosilane $SiH_4$ or dichlorosilane $SiCl_2H_2$ and $WF_6$ when the CVD method is performed.

A first W thin layer 120a and a second W thin layer 120b are formed on the barrier layer 106, and a Ni thin layer 130 is interposed between the first and second W thin layers 120a and 120b. That is, a composite thin layer including the first and second W thin layers 120a and 120b and the Ni thin layer 130 is formed on the barrier layer 106.

When the first and second W thin layers 120a and 120b and the Ni thin layer 130 are annealed at a temperature of approximately 850° C. for approximately 10 minutes, as depicted in FIG. 12, a W—Ni alloy thin layer is formed by diffusing Ni atoms in the Ni thin layer 130 into the first and second W thin layers 120a and 120b.

The composition of the W—Ni alloy thin layer may be controlled via thicknesses of the first and second W thin layers 120a and 120b and the Ni thin layer 130. For example, if the first and second W thin layers 120a and 120b are deposited to a thickness of approximately 200 Å, and the Ni thin layer 130 is deposited to a thickness of approximately 10 Å, the weight of Ni in the W—Ni alloy thin layer may be approximately 1 wt % of the total weight of the W—Ni alloy thin layer.

In a semiconductor device according to other embodiments, the W—Ni alloy thin layer may be formed on the barrier layer 106 using other methods. For example, the W—Ni alloy thin layer may be formed on the barrier layer 106 by a PVD method using a sputtering target containing an alloy of tungsten and Ni. The W—Ni alloy thin layer can constitute a gate electrode layer.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A semiconductor device of comprising a W—Ni alloy thin layer, wherein the weight of Ni in the W—Ni alloy thin layer is in a range from approximately 0.01 to approximately 5.0 wt % of the total weight of the W—Ni alloy thin layer, and wherein the weight of W in the W—Ni alloy is in a range from approximately 95.0 to approximately 99.99 wt % of the total weight of the W—Ni alloy thin layer.

2. The semiconductor device of claim 1, wherein the weight of Ni in the W—Ni alloy thin layer is in a range from approximately 0.01 to approximately 2.0 wt % of the total weight of the W—Ni alloy thin layer.

3. The semiconductor device of claim 1, wherein the weight of Ni in the W—Ni alloy thin layer is in a range from approximately 0.01 to approximately 1.0 wt % of the total weight of the W—Ni alloy thin layer.

4. The semiconductor device of claim 1, wherein the W—Ni alloy thin layer constitutes a part of a gate pattern.

5. The semiconductor device of claim 1, wherein the W—Ni alloy thin layer constitutes a part of a bit line.

6. The semiconductor device of claim 1, wherein the W—Ni alloy thin layer constitutes a part of a contact pattern.

7. The semiconductor device of claim 1, wherein the W—Ni alloy thin layer constitutes a part of a wire pattern.

8. The semiconductor device of claim 1, wherein the W—Ni alloy thin layer is formed by annealing a composite thin layer of at least one W thin layer and at least one Ni thin layer, which is formed by alternately and sequentially depositing the at least one W thin layer and the at least one Ni thin layer, in a temperature range from approximately 750 to approximately 950° C. for a time range from approximately 5 to approximately 15 minutes.

9. The semiconductor device of claim 1, wherein the W—Ni alloy thin layer is formed by physical vapor deposition (PVD) using a sputtering target containing W and Ni.

10. A semiconductor device comprising:
a gate insulating layer pattern;
a polysilicon layer pattern formed on the gate insulating layer pattern;
an ohmic contact layer formed on the polysilicon layer pattern;
a barrier layer formed on the ohmic contact layer; and
a gate electrode layer formed on the barrier layer,
wherein the gate electrode layer comprises a W—Ni alloy thin layer, and
wherein the weight of Ni in the W—Ni alloy thin layer is in a range from approximately 0.01 to approximately 5.0 wt % of the total weight of the W—Ni alloy thin layer.

11. The semiconductor device of claim 10, wherein the barrier layer comprises TiN, WN, or a combination of TiN and WN.

12. The semiconductor device of claim 10, wherein the ohmic contact layer comprises $WSi_x$, Ti, or a combination of $WSi_x$ and Ti.

13. The semiconductor device of claim 10, wherein the weight of Ni in the W—Ni alloy thin layer is in a range from approximately 0.01 to approximately 2.0 wt % of the total weight of the W—Ni alloy thin layer.

14. The semiconductor device of claim 10, wherein the weight of Ni in the W—Ni alloy thin layer is in a range from approximately 0.01 to approximately 1.0 wt % of the total weight of the W—Ni alloy thin layer.

15. The semiconductor device of claim 10, wherein the W—Ni alloy thin layer is formed by annealing a composite thin layer of at least one W thin layer and at least one Ni thin layer, which is formed by alternately and sequentially depositing the at least one W thin layer and the at least one Ni thin layer, at a temperature range from approximately 750 to approximately 950° C. for a time range from approximately 5 to approximately 15 minutes.

16. The semiconductor device of claim 10, wherein the W—Ni alloy thin layer is formed by PVD using a sputtering target containing an alloy of W and Ni.

* * * * *